(12) United States Patent
Fukui

(10) Patent No.: US 7,749,430 B2
(45) Date of Patent: Jul. 6, 2010

(54) MEMBER FOR SEMICONDUCTOR DEVICE AND PRODUCTION METHOD THEREOF

(75) Inventor: Akira Fukui, Toyama (JP)

(73) Assignee: A.L.M.T. Corp., Tokyo (JP)

(*) Notice: Subject to any disclaimer, the term of this patent is extended or adjusted under 35 U.S.C. 154(b) by 260 days.

(21) Appl. No.: 11/795,251

(22) PCT Filed: Jan. 11, 2006

(86) PCT No.: PCT/JP2006/000181

§ 371 (c)(1),
(2), (4) Date: Jul. 13, 2007

(87) PCT Pub. No.: WO2006/077755

PCT Pub. Date: Jul. 27, 2006

(65) Prior Publication Data

US 2008/0122052 A1    May 29, 2008

(30) Foreign Application Priority Data

Jan. 20, 2005    (JP) .............................. 2005-012221

(51) Int. Cl.
*C22C 32/00*    (2006.01)
*H01L 23/00*    (2006.01)

(52) U.S. Cl. .................. 419/26; 257/E23.009; 257/77; 257/706; 257/707; 419/8; 419/17; 361/720; 174/252

(58) Field of Classification Search .......... 257/E21.503, 257/E23.005, E23.009, E23.106, E23.113, 257/678, 706, 707, 712, 77; 419/8, 14, 17, 419/26, 38; 361/704, 720; 428/901; 174/252, 174/163, 256, 257, 259
See application file for complete search history.

(56) References Cited

U.S. PATENT DOCUMENTS 5,581,876 A * 12/1996 Prabhu et al. .................. 29/851

(Continued)

FOREIGN PATENT DOCUMENTS

EP            0 629 595 A    12/1994

(Continued)

OTHER PUBLICATIONS

Supplementary European Search Report issued in European Patent Application No. EP 06711530.3-1235 dated Feb. 2, 2009.

(Continued)

*Primary Examiner*—Chris C Chu
(74) *Attorney, Agent, or Firm*—McDermott Will & Emery LLP

(57) ABSTRACT

A member for a semiconductor device of low price, capable of forming a high quality plating layer on a surface, having heat conductivity at high temperature (100° C.) of more than or equal to 180 W/m·K and toughness that will not cause breaking due to screwing, and will not cause solder breaking due to heat stress when it is bonded to other member with solder, and a production method thereof are provided. A member for a semiconductor device (1) having a coefficient of thermal expansion ranging from $6.5 \times 10^{-6}/K$ to $15 \times 10^{-6}/K$ inclusive, and heat conductivity at 100° C. of more than or equal to 180 W/m·K, has: a base material (11) formed of an aluminum-silicon carbide composite material starting from powder material in which particulate silicon carbide is dispersed in aluminum or aluminum alloy, and the content of the silicon carbide is from 30% by mass to 85% by mass inclusive; and a superficial layer (12) containing aluminum or aluminum alloy starting from a melt material bonded on top and bottom faces of the base material (11).

10 Claims, 3 Drawing Sheets

U.S. PATENT DOCUMENTS

| | | | |
|---|---|---|---|
| 5,675,474 A * | 10/1997 | Nagase et al. | 361/704 |
| 5,774,336 A | 6/1998 | Larson | |
| 5,939,214 A * | 8/1999 | Mahulikar et al. | 428/626 |
| 6,123,895 A * | 9/2000 | Yamagata et al. | 419/13 |
| 6,388,273 B1 * | 5/2002 | Yamagata et al. | 257/77 |
| 7,470,982 B2 * | 12/2008 | Takashima et al. | 257/706 |

FOREIGN PATENT DOCUMENTS

| | | |
|---|---|---|
| EP | 1 416 533 A | 5/2004 |
| EP | 1 498 946 A | 1/2005 |
| JP | 63-192801 | 8/1988 |
| JP | 9-157773 | 6/1997 |
| JP | 10-335538 | 12/1998 |
| JP | 11-310843 | 11/1999 |
| JP | 2000-160267 | 6/2000 |
| JP | 2000-192182 | 7/2000 |
| JP | 2002-235126 | 8/2002 |
| JP | 2003-253371 | 9/2003 |
| JP | 2003253371 A * | 9/2003 |
| JP | 2004-091862 | 3/2004 |
| JP | 2004-288912 | 10/2004 |

OTHER PUBLICATIONS

European Office Action issued in European Patent Application No. EP 06 711 530.3 dated Feb. 16, 2010.

\* cited by examiner

MEMBER FOR SEMICONDUCTOR DEVICE AND PRODUCTION METHOD THEREOF

RELATED APPLICATIONS

This application is the U.S. National Phase under 35 U.S.C. §371 of International Application No. PCT/JP2006/300181, filed on Jan. 11, 2006, which in turn claims the benefit of Japanese Application No. 2005-012221, filed on Jan. 20, 2005, the disclosures of which Applications are incorporated by reference herein.

TECHNICAL FIELD

The present invention generally relates to a member for a semiconductor device and a production method thereof, and more specifically to a member for a semiconductor device serving as a heat radiator member such as a heat spreader or lid member constituting a semiconductor device, and a production method thereof.

BACKGROUND ART

For example, in a power device which is a semiconductor device of high performance, for insulation of a silicon (Si) chip serving as a semiconductor integrated circuit device (IC), such a structure is employed that an Si chip is soldered on aluminum nitride (AlN) sintered substrate having copper (Cu) or aluminum (Al) on its surface, and under the AlN sintered substrate; a member for a semiconductor device which is an object of the present invention is soldered; and the member for a semiconductor device is fixed with screw to a radiator formed of aluminum alloy in order to cool the member for a semiconductor device with water.

At present, as such a member for a semiconductor device, copper (Cu)-molybdenum (Mo)-based composite alloy is mainly used. However, Mo has problems of high costs and a high specific gravity.

To the contrary, an aluminum (Al)-silicon carbide (SiC) composite material can be produced from inexpensive materials such as Al and SiC without causing pollution problems, and its coefficient of thermal expansion can be adjusted in wide range in accordance with an incorporated Si chip, peripheral member and the like, so that it is a light-weight and excellent member for a semiconductor device. However, there still remain several problems in using an Al—SiC composite material as a member for a power device, and an Al—SiC composite material is not regularly adopted except for in certain devices.

For example, when an Al—SiC composite material is used as a member for a power device which is one exemplary application of a member for a semiconductor device, the following problems arise.

(1) Since a member for a semiconductor device is soldered to other member, it is necessary to plate the surface with, for example, nickel (Ni). For example, when the resultant plating has a defect, a void occurs in solder, which may deteriorate performance and shorten the lifetime of the semiconductor device. Plating on the surface of the Al—SiC composite material faces the problem that porous defects occur in the case of an Al—SiC composite material produced by sintering or self-infiltration, and cracking occurs in SiC in the case of an Al—SiC composite material produced by sintering plus forging, and shedding of SiC particles occurs due to grinding which is a pre treatment in any of these production methods. Therefore, there is a problem that it is impossible to form a plated layer with high quality on the surface of the member for a semiconductor device.

(2) With increased performance and decreased size of power device, it becomes more apparent that low heat conductivity at a high temperature of the member for a semiconductor device decreases the performance of the device, and shortens lifetime. For this reason, it is currently requested that heat conductivity at high temperature (100° C.) is more than or equal to 180 W/m·K. Therefore, it is necessary to further increase heat conductivity of Al—SiC composite material at high temperature.

(3) It is important for a power converter device which is one kind of power device, to efficiently transfer generated heat at Si chip to a radiator. A member for a semiconductor device is fixed to a radiator of Al alloy with screw, however, since the Al—SiC composite material is fragile, it may break, and breaking occur particularly at the site of screwing, leading device failure.

(4) In a power device, heat resistance is decreased by bonding constituting parts or members with solder for improvement of heat radiation property. In recent years, as power devices are used in hybrid EV cars or EV cars, and lighter weight, higher reliability and longer lifetime are demanded. On the other hand, as the environmental problems increase, solder materials tend to be free from lead (Pb). When a solder material having less ductility is bonded with a material having high Young's module, heat stress concentrates the solder part, and breaking may occur, leading the problem of shortening device lifetime. In particular, since a Pb-free solder material is inferior in ductility to the Pb-containing solder material, this problem tends to be further closed up.

(5) A member for a semiconductor device is requested to be low in cost.

In order to obtain a member for a semiconductor device having the coefficient of thermal expansion which is adjustable in wide range, in particular in the range of $6.5 \times 10^{-6}$/K to $15 \times 10^{-6}$/K inclusive, in accordance with the incorporated Si chip, peripheral members and the like, and having high heat conductivity for realizing a high heat radiation property and light weight, various cases using composite materials of aluminum and silicon carbide as described below have been proposed.

JP-A 11-310843 publication (Patent document 1) discloses a member for a semiconductor device having excellent heat conductivity which is produced by a method including a step of sintering at temperature between 600° C. and the melting point of Al, inclusive, in non-oxidizing atmosphere, following a powder mixing and molding step, or produced by a so-called hot forging method (atmosphere is preferably non-oxidizing atmosphere, upper limit temperature is 800° C.) including a step of heating under pressure at a temperature of more than or equal to 700° C. (upper limit 900° C.) or a step of heating under pressure after preheating a sintered body at a temperature of more than or equal to 600° C. and pouring it into a dye. In such a member for a semiconductor device, when plating is conducted on the surface, it is impossible to prevent plating defects caused by shedding of SiC, porous defects, cracking of SiC and the like, so that voids occur in solder, and the performance of semiconductor device may decrease and lifetime may be shortened. Further, such a measure is insufficient for solving the problems of breaking at the site of screwing and of breaking of solder due to concentration of heat stress. Further, such a member for a semiconductor device realizes improvement in heat conductivity by being produced through pressuring process at temperature at which liquid phase arises.

JP-A 2000-192182 publication (Patent document 2) discloses a silicon carbide-based composite material having excellent heat conductivity despite high porosity, produced by a method including heat treating a molded body in vacuo at temperature less than melting point, starting from a material which is used for a heat radiator substrate of semiconductor device, and sintering at temperature not less than the melting point. When such a material is used for a member for a semiconductor device, voids will occur in solder due to high porosity and plating defects, which may deteriorate the performance of semiconductor device and shorten the lifetime. Further, such a measure is insufficient for solving the problems of breaking at the site of screwing and of breaking of solder due to concentration of heat stress. Further, such a silicon carbide-based composite material realizes improvement in heat conductivity by being produced through forging at temperature at which liquid phase arises.

JP-A 2000-160267 publication (Patent document 3) discloses a silicon carbide-based composite material having excellent heat conductivity, produced by a method of heating a molded body of material used for a radiator substrate of semiconductor device at a temperature of melting point or higher, followed by forging under pressurizing to make a forged body. In such a material, when plating is conducted, it is impossible to prevent plating defects caused by shedding of SiC, porous defects, cracking of SiC and the like, so that voids occur in solder, and the performance of semiconductor device may decrease and lifetime may be shortened. Further, such a measure is insufficient for solving the problems of breaking at a part where screwing is conducted and of breaking of solder due to concentration of heat stress. Further, such a silicon carbide-based composite material realizes improvement in heat conductivity by being produced through forging at temperature at which liquid phase arises.

JP-A 2004-288912 publication (Patent document 4) discloses a lid-type member for a semiconductor device having high dimension accuracy as a semiconductor heat radiator substrate which is subjected to forging process at a temperature ranging from 650 to 800° C. in atmospheric air after sintering a molded body at a temperature of not more than melting point. In such a member for a semiconductor device, when plating is conducted, it is impossible to prevent plating defects caused by shedding of SiC, porous defects, cracking of SiC and the like, so that voids occur in solder, and the performance of semiconductor device may decrease and lifetime may be shortened. Further, such a measure is insufficient for solving the problems of breaking at the site of screwing and of breaking of solder due to concentration of heat stress. Since it is produced through forging at temperature at which liquid phase arises, a lid-type member for a semiconductor device having excellent dimension accuracy is obtained.

Therefore, when a member for a semiconductor device is formed using a composite material of aluminum and silicon carbide disclosed in any one of the above disclosed publications, it is impossible to obtain a member for a semiconductor device capable of solving the problems (1), (3) and (4) while solving the problems (2) and (5), although the above problems (2) and (5) can be solved.

By the way, also disclosed is a member for a semiconductor device shown below using a composite material of aluminum and silicon carbide.

JP-A 10-335538 publication (Patent document 5) discloses a member for a semiconductor device having improved bonding strength with resin by providing a covering layer based on aluminum on the surface of a composite material of aluminum and silicon carbide produced by sintering, having heat conductivity of more than or equal to 100 W/mK (or 180 W/m·K or more) and a coefficient of thermal expansion of less than or equal to $20\times10^{-6}$/K. As a concrete technique for improving bonding strength with resin, there is disclosed post application of an Al layer having a thickness ranging from 1 to 100 μm by plating, vapor deposition or screen printing on the surface of an Al—SiC composite material which is rusticated after production of an Al—SiC composite material.

However, as disclosed in the above publications, even when the above problems (1), (3) and (4) are attempted to be solved by forming an Al layer afterward on the surface of an Al—SiC composite material, it is difficult to be achieved due to the following reasons. When such a member for a semiconductor device is applied to a member for used in a power device, it is necessary to make heat resistance smaller, and hence it is necessary to realize stronger bonding between an Al—SiC composite material and an Al layer. The bonding strength between an Al layer which is formed afterward by plating, vapor deposition or screen printing, and an Al—SiC composite material is insufficient. Further, when an Al layer formed by plating, vapor deposition or screen printing is a thin film, defects may occur in the Al layer, so that there is a possibility that voids occur in solder when other member is soldered on surface of the Al layer, and problems of deterioration in the performance of semiconductor device, and shortened lifetime occur. Such possibility can be avoided by making the Al layer a thick film, however, this measure leads increase in production cost. Further, this measure is insufficient for solving the problems of breaking at the site of screwing and of breaking of solder due to concentration of heat stress.

In order to solve the above problems (1), (3) and (4), it can be conceived that sintering or forging is conducted while an Al layer is previously formed on superficial layer of a molded body which is a starting material of an Al—SiC composite material. However, since any of production methods disclosed in the above JP-A 11-310843 (Patent document 1), JP-A 2000-192182 publication (Patent document 2), JP-A 2000-160267 publication (Patent document 3), and JP-A 2004-288912 publication (Patent document 4) is a production method involving sintering or forging at a temperature at which a liquid phase arises, it is impossible to obtain an Al—SiC composite material on which a thick Al layer is strongly bonded on its surface.

Patent document 1: Japanese Unexamined Patent Application No. 11-310843 publication Patent document 2: Japanese Unexamined Patent Application No. 2000-192182 publication Patent document 3: Japanese Unexamined Patent Application No. 2000-160267 publication Patent document 4: Japanese Unexamined Patent Application No. 2004-288912 publication Patent document 5: Japanese Unexamined Patent Application No. 10-335538 publication

DISCLOSURE OF THE INVENTION

Problems to be Solved by the Invention

As described above, conventional arts have not proposed a material satisfying all of the following required characteristics as a member for a semiconductor device.

i) A surface of a member for a semiconductor device is plated for soldering to other member. When there is a defect in this plating, for example, voids occur in solder, which may lead deterioration in the performance of semiconductor device and shortening in lifetime. Therefore, a plating layer of high quality without defects on surface of member for a semiconductor device is requested.

ii) With increased performance and downsizing of a power device, it is necessary that heat conductivity at high temperature of member for a semiconductor device is excellent. Therefore, for example, heat conductivity of member for a semiconductor device at high temperature (100° C.) should be more than or equal to 180 W/m·K.

iii) Since in a power converter device it is important to efficiently transfer generated heat at Si chip to a radiator, a member for a semiconductor device is fixed to a radiator of Al alloy with screw. Therefore, the member for a semiconductor device should have toughness of such toughness will not cause breaking screwing and the like.

iv) In a power device, parts are bonded with solder to decrease heat resistance and improve heat radiation property. Therefore, solder breaking should not occur due to heat stress even when the member for a semiconductor device is bonded to other member with solder.

v) Not only the raw material cost of the member for a semiconductor device, but also production cost should be low and the price of product should be low.

In view of the above, it is an object of the present invention to provide a member for a semiconductor device capable of satisfying all of the above characteristic requirements, and more specifically, to provide a member for a semiconductor device and production method thereof of low price, capable of forming high quality plating layer on surface, having heat conductivity at high temperature (100° C.) of more than or equal to 180 W/m·K and toughness that will not cause breaking due to screwing, and will not cause solder breaking due to heat stress when it is bonded to other member with solder.

Means for Solving the Problems

The member for a semiconductor device according to the present invention is a member for a semiconductor device having a coefficient of thermal expansion ranging from $6.5 \times 10^{-6}$/K to $15 \times 10^{-6}$/K inclusive, and heat conductivity at 100° C. of more than or equal to 180 W/m·K, and has a base material and a superficial layer. The base material is formed of an aluminum-silicon carbide composite material starting from a powder material in which particulate silicon carbide is dispersed in aluminum or aluminum alloy, and the content of the silicon carbide is from 30% by mass to 85% by mass inclusive, and has a first surface, and a second surface which is opposite face of the first surface. The superficial layer contains aluminum or aluminum alloy starting from a melt material bonded on the first surface and the second surface. The term "powder material" used herein refers to a material in powder condition or in the form of particles. The term "melt material" used herein refers to a bulky material solidified from melt condition, and implies materials having subjected to plasticizing process such as rolling after solidification.

In the member for a semiconductor device according to the present invention, on the first surface and the second surface which are outer surfaces of the base material formed of an aluminum-silicon carbide composite material, a superficial layer containing aluminum or aluminum alloy and having excellent toughness can be bonded thickly without defects.

In the member for a semiconductor device according to the present invention, it is preferable that bonding strength between a base material and a superficial layer is more than or equal to $2 \times 9.8$ MPa.

In the member for a semiconductor device according to the present invention, it is preferable that the base material and the superficial layer are bonded by a metal bond in at least a part of the interface.

Further, in the member for a semiconductor device according to the present invention, it is preferable that the average thickness of superficial layer is from 2% to 30% inclusive, of the average thickness of the member for a semiconductor device.

In the member for a semiconductor device according to the present invention, it is preferable that variation in thickness of superficial layer is within ±30% of the average thickness of the superficial layer.

In the member for a semiconductor device according to the present invention, it is preferable that the superficial layer contains a recrystallized structure of aluminum or aluminum alloy.

In the member for a semiconductor device according to the present invention, it is preferable that aluminum alloy of the superficial layer contains at least one element selected from the group consisting of magnesium (Mg), silicon (Si), titanium (Ti), copper (Cu), zinc (Zn), manganese (Mn), chromium (Cr), iron (Fe) and nickel (Ni), and the total content of the elements is from 0.005% by mass to 15% by mass inclusive.

In the member for a semiconductor device according to the present invention, the purity of aluminum in the superficial layer may be more than or equal to 99%.

In the member for a semiconductor device according to the present invention, it is preferable that hardness of superficial layer is from 25 to 185 inclusive by Vickers hardness.

In the member for a semiconductor device according to the present invention, it is preferable that the average particle diameter of particles of silicon carbide is from 10 μm to 150 μm inclusive.

Preferably, the member for a semiconductor device according to the present invention further includes a plating layer formed on the outer face.

In this case, it is preferred that the plating layer contains at least one element selected from the group consisting of nickel (Ni), copper (Cu), silver (Ag) and gold (Au), and the thickness is from 0.1 μm to 10 μm inclusive.

Preferably, the surface roughness of the plating layer is less than or equal to 2 μm by Ra.

In the member for a semiconductor device according to the present invention, it is preferable that when the length of the long side of the member for a semiconductor device is X mm, and the warp is Y mm, the value of (Y/X) is less than or equal to 0.2%.

A method of producing a member for a semiconductor device according to one aspect of the present invention includes the following steps.

a) a step of preparing mixed powder by mixing powder of aluminum or aluminum alloy and powder of silicon carbide so that content of silicon carbide is from 30% by mass to 85% by mass inclusive.

b) a step of obtaining a molded body by conducting molding while placing mixed powder between first and second melt materials of aluminum or aluminum alloy.

c) a step of compressing a molded body by heating it to a temperature of (Tm−100)° C. or higher and lower than Tm° C. when the melting point or solidus temperature of melt material is denoted by Tm° C.

According to the method of producing a member for a semiconductor device in one aspect of the present invention, it is possible to bond a superficial layer containing aluminum or aluminum alloy and having excellent toughness on a first surface and second surface of the aluminum-silicon carbide composite material in a thick manner without occurrence of defects.

In the method of producing a member for a semiconductor device according to the present invention, it is preferred that average thickness of the first and second melt materials is from 0.1 mm to 2.0 mm inclusive.

In the method of producing a member for a semiconductor device according to the present invention, it is preferred that molding pressure in the step of obtaining a molded body is more than or equal to (2×98) MPa.

Preferably, the method of producing a member for a semiconductor device according to the present invention further includes between the step of obtaining a molded body and the step of compressing, the step of obtaining a heat-treated body by subjecting the molded body to heat treatment in non-oxidizing atmosphere at a temperature of (Tm-300)° C. or higher and less than Tm° C. when the melting point or solidus temperature of melt material is denoted by Tm° C. The value of Tm is 660° C. in the case of aluminum, and 577° C. in the case of aluminum −9% by mass silicon alloy as one example of aluminum alloy.

In the method of producing a member for a semiconductor device according to the present invention, it is preferable that the heating and compressing step is conducted in non-oxidizing atmosphere.

A method of producing member for a semiconductor device according to another aspect of the present invention includes the following steps.

a) a step of preparing mixed powder by mixing powder of aluminum or aluminum alloy and powder of silicon carbide so that the content of silicon carbide is from 30% by mass to 85% by mass inclusive.

b) a step of obtaining a molded body by conducting molding while placing mixed powder between first and second melt materials of aluminum or aluminum alloy.

d) a step of rolling while heating a molded body to a temperature of (Tm-300)° C. or higher and lower than Tm° C., when melting point or solidus temperature of melt material is denoted by Tm° C.

According to the method of producing a member for a semiconductor device according to another aspect of the present invention, it is possible to bond a superficial layer containing aluminum or aluminum alloy and having excellent toughness on a first surface and second surface of the aluminum-silicon carbide composite material in a thick manner without occurrence of defects.

In the method of producing a member for a semiconductor device according to one aspect of the present invention, it is preferred that average thickness of the first and second melt materials is from 0.1 mm to 2.0 mm.

According to the method of producing a member for a semiconductor device according to another aspect of the present invention, it is preferred that the molding pressure in the step of obtaining a molded body is more than or equal to (2×98) MPa.

Preferably, the method of producing a member for a semiconductor device according to another aspect of the present invention further includes between the step of obtaining a molded body and the step of heating and rolling, the step of obtaining a heat-treated body by subjecting the molded body to heat treatment in non-oxidizing atmosphere at a temperature of (Tm-300)° C. or higher and less than Tm° C. when melting point or solidus temperature of melt material is denoted by Tm° C.

In the method of producing a member for a semiconductor device according to another aspect of the present invention, it is preferable that the step of heating and rolling is conducted in non-oxidizing atmosphere.

EFFECT OF THE INVENTION

As described above, in accordance with the present invention, since it is possible to bond a superficial layer containing aluminum or aluminum alloy and having excellent toughness on the first surface and second surface which are outer faces of the base material formed of an aluminum-silicon carbide composite material in a thick manner without occurrence of defects, it is possible to form a plating layer of high quality on the surface, and hence it is possible to obtain a member for a semiconductor device of low price capable of forming high quality plating layer on surface, having heat conductivity at high temperature (100° C.) of more than or equal to 180 W/m·K and toughness that will not cause breaking due to screwing, and will not cause solder breaking due to heat stress when it is bonded to other member with a solder.

EXPLANATION OF REFERENCE NUMERAL

1: member for a semiconductor device, 11: base material, 12: superficial layer

DETAILED DESCRIPTION OF THE INVENTION

Inventors of the present invention made diligent efforts for achieving a member for a semiconductor device satisfying all of the five required characteristics as described above and a production method thereof, and accomplished the present invention. As to a member for a semiconductor device, it is possible to obtain a material having bonding strength between aluminum-silicon carbide composite material and aluminum or aluminum alloy layer of more than or equal to 2 kgf/mm$^2$ (2×9.8 MPa) and a coefficient of thermal expansion ranging from $6.5×10^{-6}$/K to $15×10^{-6}$/K inclusive and heat conductivity at 100° C. of more than or equal to 180 W/m·K, by forming a layer of aluminum or aluminum alloy starting from a melt material as a superficial layer on top and bottom faces of an aluminum-silicon carbide composite material starting from a powder material in which 30 to 85% by mass of particulate silicon carbide is dispersed in aluminum or aluminum alloy serving as a base material, and it was found that the resultant material satisfied all the required characteristics.

Figure 1:
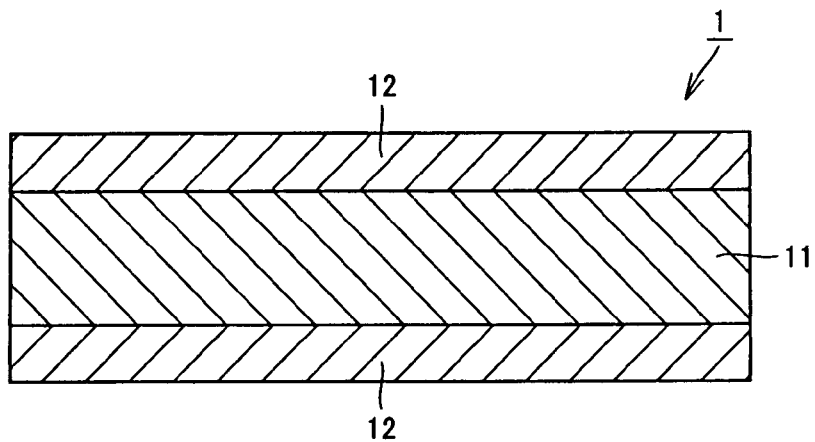
[FIG. 1] A cross section view showing a schematic section of a member for a semiconductor device which is one embodiment of the present invention.

FIG. 1 is a cross section view showing a schematic section of a member for a semiconductor device which is one embodiment of the present invention.

As shown in FIG. 1, a member for a semiconductor device 1 includes a base material 11 formed of an aluminum-silicon carbide composite material, and superficial layers 12 containing aluminum or aluminum alloy bonded onto a first and second surface which is an opposite face of the first surface, namely onto the top and bottom faces, of the base material 11.

Figure 2:
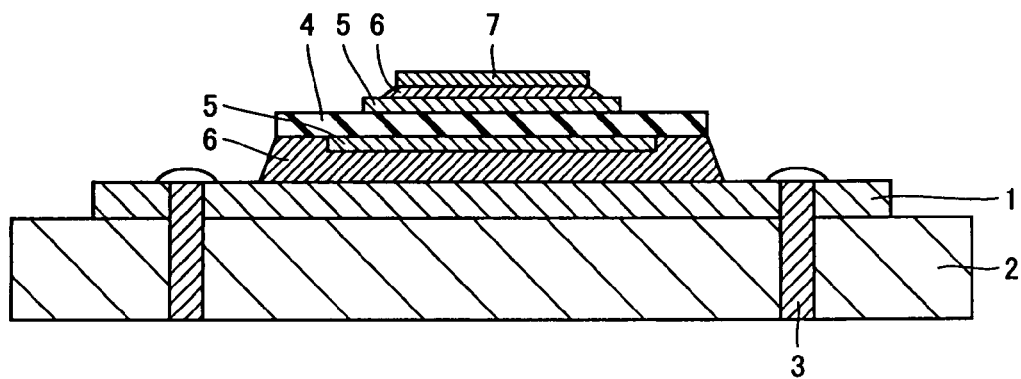
[FIG. 2] A schematic section view showing an insulated gate bipolar transistor (IGBT) unit incorporated into an automobile or the like, which is one example of a power device given as one embodiment of semiconductor device to which the member for a semiconductor device shown in FIG. 1 is applied.

FIG. 2 is a schematic section view showing an insulated gate bipolar transistor (IGBT) unit incorporated into an automobile or the like, which is one example of power device given as one embodiment of semiconductor device to which the member for a semiconductor device shown in FIG. 1 is applied.

As shown in FIG. 2, the member for a semiconductor device 1 of the present invention is fixed, as a heat radiation substrate (heat spreader material), to an aluminum or aluminum alloy substrate 2 forming a radiator with a screw 3 after a plating layer is formed on its surface. On the other hand, an insulation layer 4 realized by an aluminum nitride (AlN) sintered body formed on its top and bottom faces with copper or aluminum layer 5 is fixed via a solder layer 6 on top face of the member for a semiconductor device 1 on which plating layer is formed. On the insulation layer 4 formed on its top face with the copper or aluminum layer 5, an Si chip 7, or in the present case, a semiconductor integrated circuit element chip including an insulated gate bipolar transistor is incorporated while being fixed via a solder layer 6.

By making up the power device in the manner as described above, heat generating from the Si chip 7 is conducted and radiated to the member for a semiconductor device 1 of the present invention serving as a heat radiation substrate via the copper or aluminum layer 5, the insulation layer 4 formed of aluminum nitride (AlN) sintered body, and the copper or aluminum layer 5, having respectively high heat conductivity, and absorbed into the aluminum or aluminum alloy substrate 2 which is a constituent of a water-cooled radiator. At this time, in the member for a semiconductor device 1 of the present invention, since it is possible to bond a superficial layer 12 (FIG. 1) containing aluminum or aluminum alloy and having excellent toughness thickly without occurrence of defects, it is possible to form a plating layer of high quality on the surface, and heat conductivity at high temperature (100° C.) is more than or equal to 180 W/m·K, and toughness of such a degree that will not cause breaking, for example, by screwing with the screw 3 is realized, and solder breaking due to heat stress will not occur when bonding to an insulation layer 4 formed of nitride aluminum (AlN) sintered body is realized with the solder layer 6.

Figure 3:
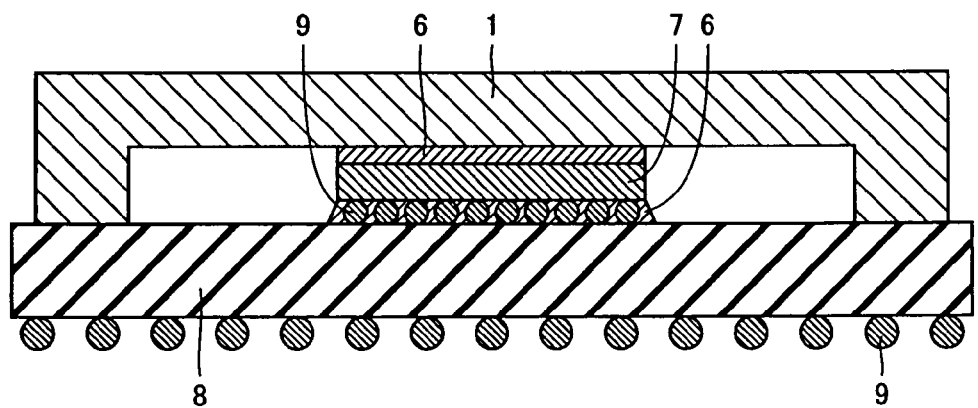
[FIG. 3] A schematic section view showing a semiconductor device having a central processing unit (CPU) such as a computer or server or semiconductor integrated circuit element chip of microprocessor unit (MPU), which is one example of another embodiment of the semiconductor device to which the member for a semiconductor device shown in FIG. 1 is applied.

FIG. 3 is a schematic section view showing a semiconductor device having a central processing unit (CPU) such as computer or server or semiconductor integrated circuit element chip of microprocessor unit (MPU), which is one example of another embodiment of the semiconductor device to which the member for a semiconductor device shown in FIG. 1 is applied.

As shown in FIG. 3, a solder ball 9 is used for electric bonding between a semiconductor integrated circuit element chip and a package (ball grid array (BGA) system). The Si chip 7 of CPU or MPU is fixed, via the solder layer 6, to a ceramic substrate in which a plurality of solder balls 9 are arranged as wiring terminus for conduction between top and bottom faces. On the top face of the Si chip 7, the member for a semiconductor device 1 of the present invention serving as a lid member having a plating layer on its surface is fixed via the solder layer 6. Peripheral parts of the member for a semiconductor device 1 are arranged to surround the Si chip 7, and fixed onto the ceramic substrate 8 with resin or the like.

By making up the semiconductor device in this manner, heat generating from the Si chip 7 is conducted to the member for a semiconductor device 1 of the present invention serving as a heat radiation substrate and radiated. At this time, in the member for a semiconductor device 1 of the present invention, since the superficial layer 12 (FIG. 1) containing aluminum or aluminum alloy and having excellent toughness can be bonded thickly without occurrence of defects, a plating layer of high quality can be formed on the surface, and heat conductivity at high temperature (100° C.) is more than or equal to 180 W/m·K, and solder breaking due to heat stress will not occur when bonding to the Si chip 7 is realized with the solder layer 6.

In the aluminum-silicon carbide composite material serving as a base material constituting the member for a semiconductor device of the present invention, an amount of silicon carbide particles is set at 30 to 85% by mass because an amount less than 30% by mass will result in a large coefficient of thermal expansion and an amount of more than 85% by mass will make condensation difficult.

By forming an aluminum or aluminum alloy layer on top and bottom faces of an aluminum-silicon carbide composite material, it becomes possible to form a plating layer of high quality on the outer surface, and excellent soldering characteristic is realized. The bonding strength between an aluminum-silicon carbide composite material and aluminum or aluminum alloy layer is set at more than or equal to 2 kgf/mm² (2×9.8 MPa) because the bonding strength of less than 2 kgf/mm² will not only cause deterioration of heat conductivity in the entire member for a semiconductor device but also cause decrease in toughness which is required in screwing, and reduce the effect of preventing breaking of solder due to heat stress. The bonding strength is preferably more than or equal to 3 kgf/mm² (3×9.8 MPa), and more preferably more than or equal to 5 kgf/mm² (5×9.8 MPa). The bonding strength is preferably lower than tensile strength of aluminum or aluminum alloy layer, for example, less than or equal to 10 kgf/mm² (10×9.8 MPa) which is tensile strength of a general aluminum flexible material.

A coefficient of thermal expansion is set within the range from $6.5\times10^{-6}$/K to $15\times10^{-6}$/K inclusive because the coefficient of thermal expansion can be adjusted in wide range in accordance with an incorporated Si chip, peripheral member and the like as a member for a powder device. Further, heat conductivity at 100° C. is set at more than or equal to 180 W/m·K because heat conductivity less than 180 W/m·K will result in the low heat conductivity of member for a semiconductor device, and the lower performance of semiconductor device and shorten lifetime.

Inventors or the present invention found that when an aluminum-silicon carbide composite material and an aluminum or aluminum alloy layer are bonded via a metal bond in a part of interface therebetween, it is possible to improve toughness and heat conductivity of the member for a semiconductor device, and to prevent concentration of heat stress of solder. Whether they are bonded via a metal bond can be determined by observation of lattice image of interface under a transmission electron microscope.

The average thickness of aluminum or aluminum alloy layer as a superficial layer is preferably from 2% to 30% inclusive, of the average thickness of the member for a semiconductor device. The average thickness of aluminum or aluminum alloy layer is set within the range from 2% to 30% inclusive, of the average thickness of the member for a semiconductor device because if it is less than 2% of the average thickness of member for a semiconductor device, toughness and alleviating effect of heat stress concentration of solder are insufficient, and if it is more than 30%, a coefficient of thermal expansion becomes too large.

Inventors of the present invention also found that allowable variation in thickness of aluminum or aluminum alloy layer as a superficial layer is within ±30% of the average thickness of aluminum or aluminum alloy layer. Allowable variation is within ±30% of the average thickness of aluminum or aluminum alloy layer because sufficient toughness will not be obtained and fluctuations in heat conductivity and in characteristic of the coefficient of thermal expansion increase when the variation exceeds ±30%.

The crystal structure of aluminum or aluminum alloy in the crystal superficial layer is more preferably recrystallized structure. When the superficial layer contains recrystallized structure, toughness is further improved, and concentration of heat stress of solder can be further alleviated. The average crystal particle diameter is preferably from 1 µm to 500 µm inclusive, and more preferably from 20 µm to 200 µm inclusive.

Any aluminum alloy is applicable insofar as aluminum alloy of superficial layer contains at least one element selected from the group consisting of Mg, Si, Ti, Cu, Zn, Mn, Cr, Fe and Ni, and the content of the total elements is from 0.005% by mass to 15% by mass inclusive. For example, when a higher strength is required for the superficial layer, aluminum may be alloyed for controlling the crystal particle diameter. In such a case, it is preferred to add at least one element selected from the group consisting of Mg, Si, Ti, Cu, Zn, Mn, Cr, Fe and Ni, and an adding amount is set in the range from 0.005% by mass to 15% by mass inclusive because the effect of addition is not obtained in an amount of less than 0.005%, and the effect will saturate in an amount exceeding 15% by mass.

When higher heat conductivity is requested by the member for a semiconductor device, it is preferred that purity of aluminum in the superficial layer is more than or equal to 99%. Purity is set at more than or equal to 99% because purity of less than 99% has less effect of improving the heat conductivity. More preferably, purity of aluminum is more than or equal to 99.5%.

Preferably, the hardness of aluminum or aluminum alloy of the superficial layer is from 25 to 185 inclusive by Vickers hardness. The hardness is set in the range from 25 to 185 inclusive by Vickers hardness because the Vickers harness of less than 25 makes fastening by screwing difficult, and the Vickers hardness exceeding 185 will result in decrease in toughness and decrease the effect of alleviating concentration of heat stress. The Vickers hardness of aluminum or aluminum alloy of the superficial layer is more preferably from 30 to 120 inclusive, and more preferably from 30 to 70 inclusive.

When the member for a semiconductor device of the present invention has excellent toughness, further advantages can be obtained such that breaking will not occur by screwing or the like, and the effect of alleviating concentration of heat stress at a soldered part increases. As an evaluation method of such toughness, the following methods can be exemplified.

(A) Drilling a through hole in the surface of member for a semiconductor device by means of super-hard alloy drill of 12 mm in diameter while applying cutting oil thereon. A bolt of M10 is inserted into the resultant through-hole and a nut is screwed via a washer with a torque of 10 kgf·m (98 N·m). At this time, superficial layer should not peel and cracking should not occur around the hole.

(B) Punching a hole of 12 mm in diameter in the member for a semiconductor device using 100 ton press. At this time, superficial layer should not peel and cracking should not occur around the hole.

(C) Conducting three-point bending test on the member for a semiconductor device. At this time, the superficial layer should not peel and displacement of bending should be larger than that of a comparative material.

(D) When tensile test is conducted, m value of Weibull distribution of tensile strength should be more than or equal to 5, and more desirably more than or equal to 15.

In the member for a semiconductor device of the present invention, the average particle diameter of silicon carbide particles in the aluminum-silicon carbide composite material is preferably from 10 µm to 150 µm inclusive. The average particle diameter is set within the range from 10 µm to 150 µm inclusive because it is difficult to bond the aluminum or aluminum alloy layer to aluminum-silicon carbide composite material with good adhesivity with particle diameters of larger than 10 µm and smaller than 150 µm.

Further, inventors of the present invention found that a member for a semiconductor device having a plating layer on its outer face in order to improve the solderability of the member for a semiconductor device provided with an aluminum or aluminum alloy layer on top and bottom faces of the aluminum-silicon carbide composite material satisfies all of the characteristics requested for a member for a semiconductor device for power device. In particular, it is preferred to apply plating having thickness ranging from 0.1 µm to 10 µm inclusive and containing at least one element selected the group consisting of Ni, Cu, Ag and Au is applied on the surface. In this case, the thickness of plating is set at 0.1 µm and less than or equal to 10 µm because thickness of less than 0.1 µm is insufficient for improving the solderability, and thickness of more than 10 µm gives adverse influence on solderability. The larger the surface roughness of the plating layer, the poorer the solder wettability, so that the surface roughness is preferably less than or equal to 2 µm by Ra. The lower limit of the surface roughness of the plating layer is, but is not particularly limited, 0.03 µm by Ra in consideration of the surface roughness which is industrially achievable. The surface roughness within the above range of the plating layer is achieved by subjecting a substrate to mechanical grinding, chemical grinding or the like prior to formation of the plating layer.

A preferred member for a semiconductor device according to the present invention satisfies value of (Y/X) of less than or equal to 0.2% when the length of the long side of the member for a semiconductor device is X mm, and the warp is Y mm. When the value of (Y/X) exceeds 0.2%, bonding with other member is insufficient and heat resistance tends to increase.

As a method of producing a member for a semiconductor device satisfying all of the requested characteristics, inventors of the present invention found that a method of producing a member for a semiconductor device which forms an aluminum or aluminum alloy layer on top and bottom faces of an aluminum-silicon carbide composite material, which includes the steps of: preparing mixed powder by mixing powder of aluminum or aluminum alloy and powder of silicon carbide so that content of silicon carbide is from 30% by mass to 85% by mass inclusive; obtaining a molded body by conducting molding while placing mixed powder between first and second melt materials of aluminum or aluminum alloy; and compressing the molded body by heating it to a temperature of (Tm-100)° C. or higher and lower than Tm° C. when the melting point or solidus temperature of the melt material is denoted by Tm° C. is preferred.

Further, inventors of the present invention found that by placing an aluminum or aluminum alloy plate on top and bottom faces in a manufacturing step of molded body to make a molded body, and heating and compressing the molded body at a temperature of (Tm-100)° C. or higher and lower than Tm° C., when the melting point or solidus temperature of melt material is denoted by Tm° C., it is possible to obtain a member for a semiconductor device having excellent adhesiveness, small variation in the thickness of layer, giving no damages such as cracking on silicon carbide particles, having excellent toughness, having desired heat conductivity, causing no breaking in solder due to concentration of heat stress, and causing little warp at low costs.

According to the production method of the present invention, although the biaxial compression is employed, a similar effect as is the case of hydrostatic pressing is obtained. Therefore, the characteristics as described above are realized. Further, since the number of steps is small, it is possible to obtain a product having excellent characteristics at low costs.

Heating and compressing temperature is set at a temperature of (Tm-100)° C. or higher and lower than Tm° C., when melting point or solidus temperature of melt material is denoted by Tm° C., because at temperature of less than (Tm-100)° C., sufficient adhesiveness, toughness, heat conductivity, and small warp cannot be achieved, and at temperature of Tm° C. or higher there arise the problems of occurrence of seizure in a mold and generation of liquid phase.

The average thickness of aluminum or aluminum alloy plate is preferably from 0.1 mm to 2.0 mm inclusive. The average thickness of aluminum or aluminum alloy plate is set within the range from 0.1 mm to 2.0 mm inclusive because damages may be caused on silicon carbide particles at a thickness of less than 0.1 mm, and the effect exerted by forming the aluminum or aluminum alloy layer as a superficial layer is saturated at a thickness of more than 2.0 mm.

When molding pressure at the molding step is more than or equal to 2 ton/cm² (2×98 MPa), it is possible to produce a member for a semiconductor device having more excellent adhesiveness and heat conductivity.

Inventors of the present invention found that heat conductivity and toughness of the member for a semiconductor device are further improved when it is produced by a method that further includes between the step of obtaining a molded body and the step of heating and compressing step, the step of obtaining a heat-treated body by subjecting the molded body to heat treatment in non-oxidizing atmosphere at a temperature of (Tm-300)° C. or higher and lower than Tm° C. when the melting point or solidus temperature of the melt material is denoted by Tm° C.

Inventors also found that heat conductivity and toughness can be further improved by conducting the heating and compressing step in the non-oxidizing atmosphere. The heating and compressing step may be conducted in atmospheric air or in oxidizing atmosphere.

As another production method of the present invention, inventors found that a member for a semiconductor device having comparable characteristics and performance can be produced at low costs even when the step of heating and compressing a molded body at a temperature of (Tm-100)° C. or higher and lower than Tm° C. when the melting point or solidus temperature of the melt material is denoted by Tm° C. is replaced by the step of heating and rolling the molded body at a temperature of (Tm-300)° C. or higher and lower than Tm° C. when the melting point or solidus temperature of the melt material is denoted by Tm° C.

The heating and rolling temperature is set at a temperature of (Tm-300)° C. or higher and lower than Tm° C. when the melting point or solidus temperature of the melt material is denoted by Tm° C. because sufficient adhesiveness, toughness, heat conductivity, and small warp cannot be achieved at temperature of less than (Tm-300)° C., and at a temperature of Tm° C. or higher there arise the problems of occurrence of seizure in a roll and generation of liquid phase.

The average thickness of aluminum or aluminum alloy plate is preferably from 0.1 mm to 2.0 mm inclusive. The average thickness of aluminum or aluminum alloy plate is set within the range from 0.1 mm to 2.0 mm inclusive because damages may be caused silicon carbide particles at a thickness of less than 0.1 mm, and the effect exerted by forming the aluminum or aluminum alloy layer as a superficial layer is saturated at a thickness of more than 2.0 mm.

When molding pressure at the molding step is more than or equal to 2 ton/cm² (2×98 MPa), it is possible to produce a member for a semiconductor device having more excellent adhesiveness and heat conductivity.

Also in this another production method of the present invention, inventors of the present invention found that heat conductivity and toughness of the member for a semiconductor device are further improved when it is produced by a method that further includes between the step of obtaining a molded body and the step of heating and rolling step, the step of obtaining a heat-treated body by subjecting the molded body to heat treatment in non-oxidizing atmosphere at a temperature of (Tm-300)° C. or higher and lower than Tm° C. when the melting point or solidus temperature of the melt material is denoted by Tm° C.

Further, also in this another production method of the present invention, inventors found that heat conductivity and toughness can be further improved by conducting the heating and rolling step in the non-oxidizing atmosphere. The heating and rolling step may be conducted in atmospheric air or in oxidizing atmosphere.

EXAMPLES

Example 1

Aluminum (Al) powder having an average particle diameter of 10 μm and silicon carbide (SiC) powder having an average particle diameter of 15 μm were mixed so that the content of SiC was as shown in Table 1 while the mixing ratio was varied, and molding was carried out while the resultant mixed powder was placed on the top and bottom faces of an aluminum plate of JIS (Japanese Industrial Standards) 1050, or in other words, in the condition that the mixed powder was sandwiched by an aluminum plate having a thickness shown in Table 1, to prepare a molded body (molding step). Molding of mixed powder was carried out so that the molding pressure was 2 ton/cm² (2×98 MPa) by applying a load of 72 tons on the powder using 100-ton pressing machine. The molded body obtained in this manner was heated and compressed while it was heated to a temperature of 600° C. so that compression pressure was 2 ton/cm² (2×98 MPa) by application of a load of 72 tons on the molded body with the use of the same pressuring machine that was used for preparing the molded body (heating and compressing step). In this manner, a sample of 60 mm in high, 60 mm in wide, and 5 mm in thick was prepared. Each sample was evaluated for the characteristics as shown below. The obtained characteristics are shown in Table 1. In Table 1, in comparative examples 4 to 7, an aluminum plate was not placed on top and bottom faces of the mixed powder in the molding step.

(I) Thickness of Al Layer [mm], Thickness Ratio of Al Layer/Sample [%]

The thickness of Al layer which was the finally obtained superficial layer (thickness on first surface side) was measured, and a ratio of Al layer relative to the thickness of sample was calculated.

(II) Variation in Thickness of Al Layer [%]

The variation in the thickness, relative to the average value of the thickness of the finally obtained superficial layer was determined.

(III) Coefficient of Thermal Expansion [×10$^{-6}$/K]

Using PIL-402PC available from NETZSCH, a sample cut into a size of 4 mm×4 mm×20 mm was heated, and an elongation was detected by a differential transformer to determine a coefficient of thermal expansion.

(IV) Heat Conductivity [W/m·K] at a Temperature of 100° C.

This was determined by laser flash method using a thermal constant measuring apparatus TC-700 available from ULVAC-RIKO, Inc. To be more specific, on either face of a sample cut out in a size of 10 mm in diameter, and 2 mm in thick was radiated with laser beam for a short time to give thermal energy, and nonstationary temperature change in the opposite face of the sample at this time was measured with a thermocouple and InSb (indium antimony) infrared detector for obtaining specific heat and a coefficient of thermal diffusivity, respectively, and whereby heat conductivity was determined.

(V) Peel Strength (Bonding Strength) of Al Layer [×9.8 MPa]

Figure 4:
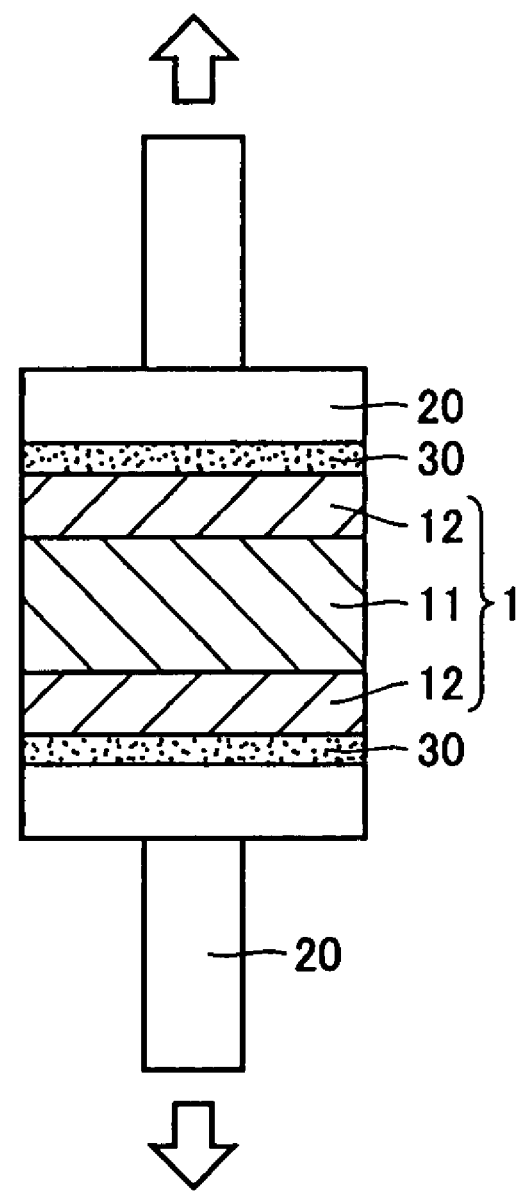
[FIG. 4] A schematic section view showing a test method for measuring peel strength of Al layer which is a superficial layer.

FIG. 4 is a schematic section view showing a test method for measuring a peel strength of Al layer which is a superficial layer.

As shown in FIG. 4, in a peeling test of Al layer, a tensile test jig 20 having a boding face of 10 mm in diameter and a holding part of tensile test of 8 mm in diameter was pasted on top and bottom faces of a test piece 1 of each sample previously cut out in a disc of 10 mm in diameter by a cutting wire, with the use of an adhesive 30 of Scotch-weld (trade name) DP460 available from Sumitomo 3M Limited, and after curing, the tensile was applied in the direction of arrow to conduct a tensile test. As a tensile test machine, Instron tensile test machine having a tensile axial alignment mechanism was used. By measuring strength until an Al layer serving as the superficial layer 12 peeled with this tensile test, bonding strength between the Al layer serving as the superficial layer 12 and an aluminum-silicon carbide composite material serving as base material 11 was evaluated.

(VI) Ratio of Warp Y/X[%]

Warp Y[mm] per length 60 [mm] of one side of each sample was measured, and ratio of warp relative to the length was calculated.

(VII) Presence/Absence of Void

Surface of each sample was plated with nickel of 2 μm thick, and heated to a temperature of 250° C., and then whether voids occurred was observed. In inventive examples 1 to 7 and comparative examples 1 and 2, occurrence of voids was not observed, however in comparative examples 4 to 7, occurrence of voids was observed in every example. Further, similar results were obtained when tests were carried out in a similar manner except that plating was conducted using copper, silver and gold in a thickness ranging from 0.1 μm to 10 μm.

(VIII) Solder Wettability

Solder wettability of inventive examples 1 to 7 plated with nickel were evaluated. In evaluation, after dipping each sample into an eutectic lead tin solder bath heated to a temperature of 200° C., the sample was drawn up, and degree of solder adhesion was examined. The samples in which a part where solder was not adhered was not observed on the surface of plating a layer after dipping, and good adhesion of solder was observed had surface roughness of plating the layer of less than or equal to 2 μm by Ra. In samples having surface roughness of plating the layer of more than or equal to 2 μm by Ra, a part where solder was not adhered was observed. Surface of each sample of inventive examples 1 to 7 was plated with copper, silver or gold inplace of nickel plating and solder wettability was evaluated, and similar results were obtained.

TABLE 1

| | | SiC [mass %] | Al plate thickness [mm] | Al layer thickness [mm] | Al layer/ sample [%] | Variation of Al layer thickness [%] | Coefficient of thermal expansion [×10$^{-6}$/K] | Heat conductivity [W/m · K] | Al layer peel strength [×9.8 MPa] | Ratio of warp (Y/X) [%] | Presence/ absence of void |
|---|---|---|---|---|---|---|---|---|---|---|---|
| Inventive example | 1 | 30 | 0.1 | 0.1 | 2 | 6 | 14.8 | 208 | 3.1 | 0.13 | Not observed |
| | 2 | 40 | 0.1 | 0.1 | 2 | 5 | 12.1 | 196 | 3.6 | 0.09 | Not observed |
| | 3 | 40 | 0.5 | 0.4 | 8 | 20 | 12.5 | 195 | 4.1 | 0.08 | Not observed |
| | 4 | 40 | 2 | 1.5 | 30 | 29 | 12.7 | 197 | 4.3 | 0.14 | Not observed |
| | 5 | 50 | 1 | 0.5 | 10 | 14 | 10 | 196 | 5.3 | 0.11 | Not observed |
| | 6 | 65 | 0.5 | 0.2 | 4 | 15 | 8 | 200 | 4.0 | 0.05 | Not observed |
| | 7 | 85 | 0.5 | 0.3 | 6 | 20 | 6.8 | 202 | 3.3 | 0.19 | Not observed |
| Comparative example | 1 | 10 | 0.5 | 0.2 | 4 | 10 | 20 | 230 | 3.5 | 0.09 | Not observed |
| | 2 | 20 | 0.6 | 0.3 | 6 | 20 | 18 | 220 | 3.0 | 0.14 | Not observed |
| | 3 | 87 | 0.3 | | | | Impossible to produce | | | | |
| | 4 | 40 | — | — | — | — | 12.6 | 164 | — | 0.33 | Observed |
| | 5 | 50 | — | — | — | — | 10.2 | 167 | — | 0.43 | Observed |
| | 6 | 65 | — | — | — | — | 8.1 | 175 | — | 0.44 | Observed |
| | 7 | 85 | — | — | — | — | 6.9 | 169 | — | 0.50 | Observed |

Results shown in Table 1 demonstrate that in inventive examples 1 to 7 in which the SiC content was from 30 to 85% by mass, a coefficient of thermal expansion was 6.5 to 15× $10^{-6}$/K and heat conductivity at a temperature of 100° C. was more than or equal to 180 W/m·K. In comparative examples 1 and 2 in which the SiC content was less than 30% by mass, a coefficient of thermal expansion was larger than $15 \times 10^{-6}$/K. Production of comparative example 3 in which the SiC content was more than 85% by mass was impossible.

In inventive examples 1 to 7 and comparative examples 1 and 2, value of (Y/X) was less than or equal to 0.2%.

A cooling and heating cycle test (temperature range from −40° C. to 150° C.) was conducted for samples of inventive examples 1 to 7 having surface plated with nickel of 2 μm thick and for samples which were obtained by plating surface with nickel of 2 μm following vapor deposition of aluminum of 3 μm thick in comparative examples 4 to 7. As a result, in comparative examples 4 to 7, peeling of an Al deposition layer was observed for every case after 100 cycles, however, in inventive examples 1 to 7, peeling of the Al layer was not observed even after 5000 cycles.

As shown in FIG. 4, a test for measuring peel strength of an All layer serving as a superficial layer was conducted using an adhesive in a similar manner as described above, and peel strength was measured. In comparative examples 4 to 7, peel strength was 0.3 to 0.4 kgf/mm² (0.3×9.8 to 0.4×9.8 MPa), while any of inventive examples 1 to 7 had peel strength over 2 kgf/mm² (2×9.8 MPa). Observation of bonding part under transmission electron microscope revealed that a part of bonding part included a metal bond in inventive examples 1 to 7.

Further, cooling and heating cycle test (temperature range from −40° C. to 150° C.) was conducted on samples obtained by soldering an AlN sintered body having a copper or aluminum layer on its surface, to samples of inventive examples 1 to 7 having surface plated with nickel of 2 μm thick, or to samples which were obtained by plating surface with nickel of 2 μm following vapor deposition of aluminum of 3 μm thick in comparative examples 4 to 7, using alloy of tin (Sn)— 3% by mass of silver (Ag)— 0.5% by mass of copper (Cu) as a solder material. As a result, in comparative examples 4 to 7, breaking was observed in a solder bonding part for every case after 100 cycles, however, in inventive examples 1 to 7, breaking in a solder bonding part was not observed even after 10000 cycles.

Example 2

Each sample in Example 1 was drilled while lubricant oil was applied to form a hole of 10.5 mm in diameter by means of a drill, and a bolt of M10 was inserted, and a nut was fastened at a torque of 10 kgf·m (98 N·m). Breaking occurred in comparative examples 5 to 7, while breaking was not observed in inventive examples 5 to 7 even torque was elevated to 15 kgf·m (15×9.8 N·m). The crystal structure of an aluminum layer serving as a superficial layer in inventive examples 5 to 7 was observed, and the average crystal particle diameter was 84 μm, 158 μm, and 34 μm, respectively.

Example 3

Samples was prepared in a similar manner as in Example 1 at an SiC content of 60% by mass, with variable the average particle diameter of SiC powder of 5 μm, 10 μm, 80 μm, 150 μm and 200 μm, and a variable thickness of an aluminum layer of 0.050 mm, 0.100 mm, 0.500 mm, 1.000 mm, 2.000 mm, and 2.500 mm. Each sample was evaluated for heat conductivity at a temperature of 100° C., variation in a thickness of an Al layer, and ratio of warp in the same manner as described in Example 1. The results are shown in Table 2, Table 3 and Table 4.

TABLE 2

Heat conductivity [W/m · K]

| SiC average particle diameter [μm] | Thickness of Al layer [mm] | | | | | |
|---|---|---|---|---|---|---|
| | 0.050 | 0.100 | 0.500 | 1.000 | 2.000 | 2.500 |
| 5 | 181 | 182 | 180 | 182 | 183 | 187 |
| 10 | 187 | 206 | 200 | 203 | 201 | 200 |
| 80 | 186 | 198 | 183 | 185 | 198 | 201 |
| 150 | 185 | 200 | 200 | 205 | 198 | 210 |
| 200 | 190 | 190 | 190 | 198 | 197 | 205 |

TABLE 3

Variation in thickness of Al layer [%]

| SiC average particle diameter [μm] | Thickness of Al layer [mm] | | | | | |
|---|---|---|---|---|---|---|
| | 0.050 | 0.100 | 0.500 | 1.000 | 2.000 | 2.500 |
| 5 | 10 | 9 | 8 | 5 | 4 | 3 |
| 10 | 30 | 15 | 12 | 10 | 6 | 3 |
| 80 | 40 | 20 | 15 | 12 | 7 | 3 |
| 150 | 55 | 25 | 18 | 14 | 8 | 4 |
| 200 | 80 | 36 | 25 | 20 | 14 | 6 |

TABLE 4

Ratio of warp (Y/X) [%]

| SiC average particle diameter [μm] | Thickness of Al layer [mm] | | | | | |
|---|---|---|---|---|---|---|
| | 0.050 | 0.100 | 0.500 | 1.000 | 2.000 | 2.500 |
| 5 | 0.11 | 0.12 | 0.15 | 0.16 | 0.18 | 0.12 |
| 10 | 0.11 | 0.11 | 0.11 | 0.14 | 0.17 | 0.23 |
| 80 | 0.12 | 0.11 | 0.16 | 0.17 | 0.18 | 0.24 |
| 150 | 0.12 | 0.14 | 0.17 | 0.18 | 0.18 | 0.30 |
| 200 | 0.10 | 0.13 | 0.18 | 0.19 | 0.20 | 0.33 |

Results shown in Table 2, Table 3 and Table 4 demonstrate that when average particle diameter of SiC powder was 5 μm, a coefficient of thermal expansion was comparable, however, heat conductivity at a temperature of 100° C. was lower than those having other particle diameters. Further, when the average particle diameter of SiC powder was 200 μm, a part where the thickness of the aluminum layer was not uniform and thin occurred at a thickness of the aluminum layer of 0.050 mm. When a thickness of the aluminum layer was larger than 2.500 mm, tendency that the warp becomes greater was observed.

Example 4

In production methods of inventive examples 1 to 7 shown in Table 1, samples were produced with varied molding pressures. Influence of molding pressure exerted on a coefficient of thermal expansion and heat conductivity at a temperature of 100° C. was examined. The coefficient of thermal expansion and heat conductivity were determined in a similar manner as described in Example 1. Results are shown in Table 5. In Table 5, "α" and "κ" mean a coefficient of thermal expansion and heat conductivity, respectively.

TABLE 5

| Coefficient of thermal expansion α | Heat conductivity κ | Molding pressure | | | | | | | |
|---|---|---|---|---|---|---|---|---|---|
| | | 98 MPa | | 1.4 × 98 MPa | | 2 × 98 MPa | | 3 × 98 MPa | |
| [×10⁻⁶/K] | [W/m · K] | α | κ | α | κ | α | κ | α | κ |
| Inventive example | 1 | 14.9 | 190 | 14.8 | 208 | 14.7 | 208 | 14.7 | 208 |
| | 2 | 12.3 | 188 | 12.1 | 196 | 11.8 | 199 | 11.7 | 200 |
| | 3 | 12.8 | 187 | 12.5 | 195 | 12.4 | 198 | 12.3 | 199 |
| | 4 | 12.9 | 183 | 12.7 | 197 | 12.6 | 198 | 12.6 | 199 |
| | 5 | 11 | 189 | 10 | 196 | 9.8 | 198 | 9.7 | 199 |
| | 6 | 9.1 | 184 | 8 | 200 | 7.9 | 204 | 7.8 | 206 |
| | 7 | 7.7 | 183 | 6.8 | 202 | 6.7 | 208 | 6.7 | 210 |

Results shown in Table 5 demonstrate that the higher the molding pressure, the smaller the coefficient of thermal expansion and the higher heat conductivity at a temperature of 100° C.

Toughness of samples obtained at molding pressure of 98 MPa and 2×98 MPa in the inventive example 5 was evaluated. Toughness was evaluated by a ratio of number of samples in which breaking occurred when each sample was drilled while lubricant oil was applied to form a hole of 10.5 mm in diameter by means of a drill, and a bolt of M10 was inserted, and a nut was fastened at a torque of 20 kgf·m (2×98 N·m), relative to the total number of samples. Ratio of number of samples in which breaking occurred at a molding pressure of 2×98 MPa was 20%, compared to that at molding pressure of 98 MPa. It can be understood that the higher molding pressure, the more toughness improves.

Example 5

In the production methods of inventive examples 1 to 7 shown in Table 1, a sample was prepared in a similar manner as in Example 1 except that between the molding step and the heating and compressing step, the molded body was heated for 5 hours at a temperature of 600° C. in nitrogen gas atmosphere. Influence of the heating process which is an intermediate step exerted on a coefficient of thermal expansion and heat conductivity at a temperature of 100° C. was examined. The coefficient of thermal expansion and heat conductivity were determined in a similar manner as described in Example 1. Results are shown in Table 6. In Table 6, "α" and "κ" mean a coefficient of thermal expansion and heat conductivity, respectively.

TABLE 6

| Coefficient of thermal expansion α | Heat conductivity κ | Heating process | | | |
|---|---|---|---|---|---|
| | | Conducted | | Not conducted | |
| [×10⁻⁶/K] | [W/m · K] | α | κ | α | κ |
| Inventive example | 1 | 14.6 | 212 | 14.8 | 208 |
| | 2 | 12.1 | 201 | 12.1 | 196 |
| | 3 | 12.5 | 199 | 12.5 | 195 |
| | 4 | 12.6 | 202 | 12.7 | 197 |
| | 5 | 9.9 | 202 | 10 | 196 |
| | 6 | 7.8 | 209 | 8 | 200 |
| | 7 | 6.7 | 211 | 6.8 | 202 |

Results shown in Table 6 demonstrate that conducting the heating process as an intermediate step improves heat conductivity.

In inventive example 5, toughness was evaluated for samples having experienced heating process and not experienced heating process. Toughness was evaluated by a ratio of number of samples in which breaking occurred when each sample was drilled while lubricant oil was applied to form a hole of 10.5 mm in diameter by means of a drill, and a bolt of M10 was inserted, and a nut was fastened at a torque of 20 kgf·m (2×98 N·m), relative to the total number of samples. The ratio of number of samples in which breaking occurred in the samples having experienced heating process was 10%, compared to the samples not having experienced heating process. It can be understood that toughness improves when heating process is conducted as an intermediate step.

Figure 5:
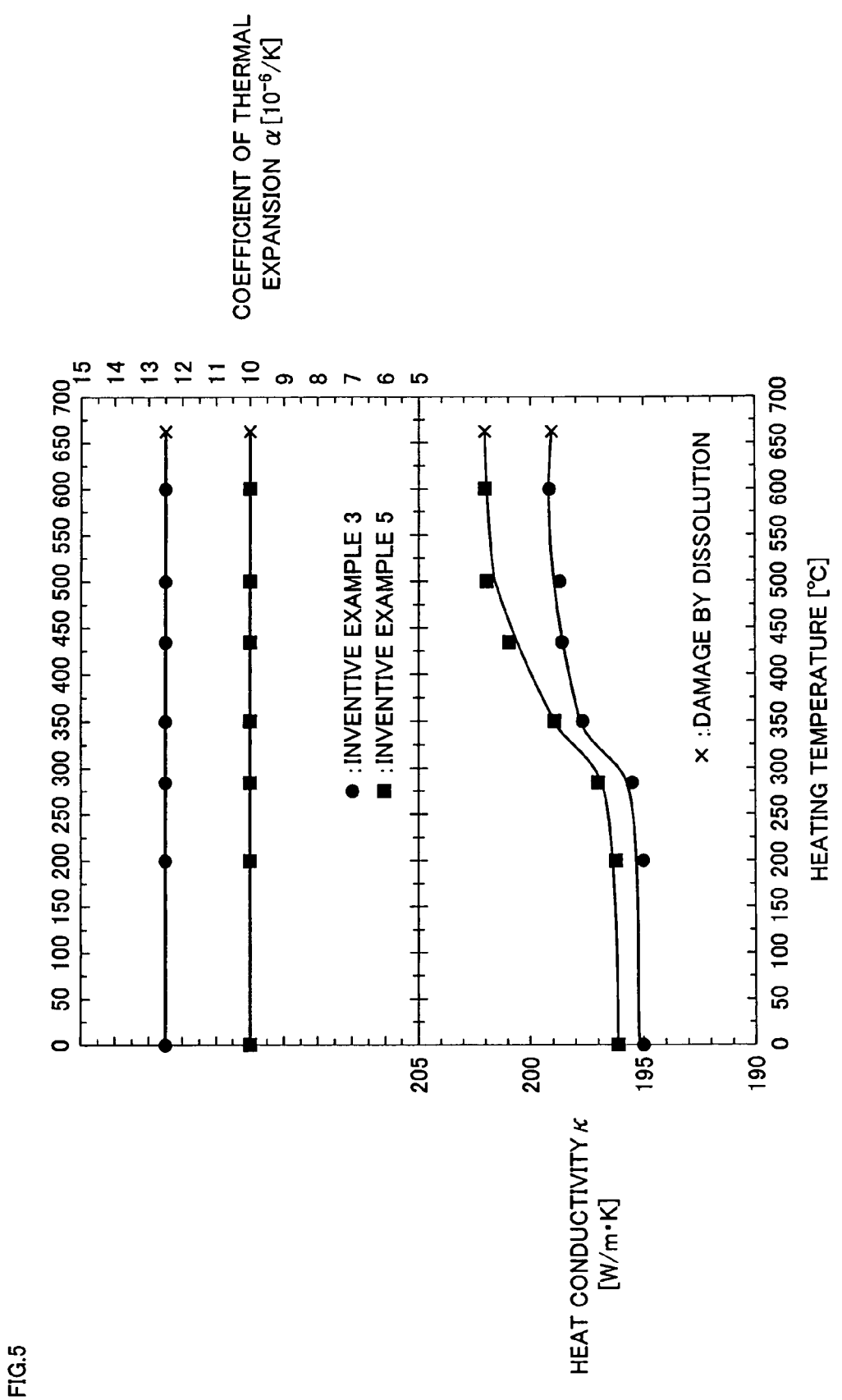
[FIG. 5] A view showing the influence of heating temperature in heating treatment step exerted on a coefficient of thermal expansion and heat conductivity at 100° C.

Further, in inventive example 3 and inventive example 5 shown in Table 1, by varying the heating temperature in the heating process step in nitrogen gas atmosphere conducted between the molding step and heating and compressing step, influence of the heating temperature exerted on a coefficient of thermal expansion and heat conductivity at a temperature of 100° C. was examined. The coefficient of thermal expansion and heat conductivity were determined in a similar manner as described in Example 1. Results are shown in FIG. 5. In FIG. 5, horizontal axis represents heating temperature, left vertical axis represents heat conductivity κ, and right vertical axis represents a coefficient of thermal expansion α. Results shown in FIG. 5 demonstrate that heat conductivity is improved when heating process is conducted as an intermediate step at heating temperature of more than or equal to $(Tm-300)°$ C. (more than or equal to about 350° C. in inventive example 3 and inventive example 5).

Example 6

Aluminum (Al) powder having an average particle diameter of 10 μm and silicon carbide (SiC) powder having an average particle diameter of 15 μm were mixed in variable mixing ratio so that the content of SiC was as shown in Table 7 while varying mixing ratio, and molding was carried out while the resultant mixed powder is placed on the top and bottom faces of an aluminum plate of JIS (Japanese Industrial Standards) 1050, or in other words, in the condition that the mixed powder was sandwiched by an aluminum plate having a thickness shown in Table 7, to prepare a molded body (molding step). Molding of mixed powder was carried out so that the molding pressure is 2 ton/cm² (2×98 MPa) by applying a load of 72 tons on the powder using 100-ton pressing machine. The molded body obtained in this manner was then heated and rolled by being subjected to hot rolling involving five passages at 5% reduction while it was heated to a temperature of 600° C. (heating and rolling step). In this manner, a sample of 60 mm high×60 mm wide×5 mm thick was prepared. Each sample was evaluated for the characteristics in a similar manner as in Example 1. The obtained characteristics are shown in Table 7.

TABLE 7

|  | | SiC [% by mass] | Al plate thickness [mm] | Al layer thickness [mm] | Al layer/sample [%] | Variation in Al layer thickness [%] | Coefficient of thermal expansion [×10$^{-6}$/K] | Heat conductivity [W/m · K] | Al layer peel strength [×9.8 MPa] | Ratio of warp (Y/X) [%] |
|---|---|---|---|---|---|---|---|---|---|---|
| Inventive example | 2 | 40 | 0.4 | 0.3 | 6 | 11 | 12.5 | 197 | 4.3 | 0.10 |
| | 4 | 50 | 0.6 | 0.4 | 8 | 14 | 9.9 | 197 | 4.9 | 0.12 |
| | 5 | 65 | 0.5 | 0.2 | 4 | 17 | 8.0 | 203 | 5.2 | 0.11 |
| | 6 | 85 | 0.8 | 0.3 | 6 | 22 | 6.8 | 206 | 3.7 | 0.19 |

Surface of each sample was plated with nickel of 2 μm thick, and heated to a temperature of 250° C., and then presence of void was observed. However, occurrence of void was not observed.

Each sample plated with nickel of 2 μm thick on the surface was subjected to cooling and heating cycle test (temperature range of −40° C. to 150° C.), and no peeling was observed in an Al layer after 5000 cycles.

Each sample obtained by plating surface with nickel of 2 μm soldered with alloy of tin (Sn)— 3% by mass of silver (Ag)— 0.5% by mass of copper (Cu) as a solder material was subjected to cooling and heating cycle test (temperature range of −40° C. to 150° C.), and no breaking was observed in solder bonding part after 10000 cycles.

It is to be understood that the embodiments and examples disclosed in the above are given for exemplification and not for limitation in all respects. The scope of the present invention is defined by attached claims and not by the above embodiments and examples, and embraces any changes and modification made within the meanings and coverage of equivalence of claims.

INDUSTRIAL APPLICABILITY

The member for a semiconductor device of the present invention is used as a heat radiation member such as heat spreader member or lid member in a semiconductor device called a power device such as insulated gate bipolar transistor (IGBT) unit mounted in, e.g., automobile, or in semiconductor device into which semiconductor integrated circuit element chip or central processing unit (CPU) unit such as computer or server, or microprocessor unit (MPU) is incorporated.

The invention claimed is:

1. method of producing a member for a semiconductor device comprising the steps of:
    preparing mixed powder by mixing powder of aluminum or aluminum alloy and powder of silicon carbide so that the content of the silicon carbide is from 30% by mass to 85% by mass inclusive;
    obtaining a molded body by molding while placing the mixed powder between first and second plates of aluminum or aluminum alloy which have in advance been subjected to a rolling process after solidification from a molten state; and
    compressing the molded body by heating the molded body to a temperature of (Tm−100)° C. or higher and lower than Tm° C. when the melting point or solidus temperature of the plates is denoted by Tm° C.

2. The method of producing a member for a semiconductor device according to claim 1, wherein the average thickness of the first and second melt materials is from 0.1 mm to 2.0 mm inclusive.

3. The method of producing a member for a semiconductor device according to claim 1, wherein the molding pressure in the step of obtaining a molded body is more than or equal to (2×98) MPa.

4. The method of producing a member for a semiconductor device according to claim 1, further comprising, between the step of obtaining a molded body and the step of compressing, the step of obtaining a heat-treated body by subjecting the molded body to heat treatment in non-oxidizing atmosphere at a temperature of (Tm−300)° C. or higher and lower than Tm° C. when the melting point or solidus temperature of aluminum or aluminum alloy is denoted by Tm° C.

5. The method of producing a member for a semiconductor device according to claim 1, wherein the step of compressing is conducted in non-oxidizing atmosphere.

6. A method of producing a member for a semiconductor device comprising the steps of:
    preparing mixed powder by mixing powder of aluminum or aluminum alloy and powder of silicon carbide so that the content of silicon carbide is from 30% by mass to 85% by mass inclusive;
    obtaining a molded body by molding while placing the mixed powder between first and second plates of aluminum or aluminum alloy which have in advance been subjected to a rolling process after solidification from a molten state; and
    heating and rolling the molded body at a temperature of (Tm−300)° C. or higher and lower than Tm° C. when the melting point or solidus temperature of aluminum or aluminum alloy is denoted by Tm° C.

7. The method of producing a member for a semiconductor device according to claim 6, wherein the average thickness of the first and second melt materials is from 0.1 mm to 2.0 mm inclusive.

8. The method of producing a member for a semiconductor device according to claim 6, wherein the molding pressure in the step of obtaining a molded body is more than or equal to (2×98) MPa.

9. The method of producing a member for a semiconductor device according to claim 6, further comprising, between the step of obtaining a molded body and the step of heating and rolling, the step of obtaining a heat-treated body by subjecting the molded body to heat treatment in non-oxidizing atmosphere at a temperature of (Tm−300)° C. or higher and lower than Tm° C. when the melting point or solidus temperature of the melt material is denoted by Tm° C.

10. The method of producing a member for a semiconductor device according to claim 6, wherein the step of heating and rolling is conducted in non-oxidizing atmosphere.

* * * * *